(12) United States Patent
Hayes et al.

(10) Patent No.: US 11,791,283 B2
(45) Date of Patent: Oct. 17, 2023

(54) SEMICONDUCTOR DEVICE PACKAGING WARPAGE CONTROL

(71) Applicant: NXP USA, INC., Austin, TX (US)

(72) Inventors: Scott M. Hayes, Chandler, AZ (US); Michael B. Vincent, Chandler, AZ (US); Zhiwei Gong, Chandler, AZ (US); Richard Te Gan, Chandler, AZ (US); Vivek Gupta, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 112 days.

(21) Appl. No.: 17/230,098

(22) Filed: Apr. 14, 2021

(65) Prior Publication Data

US 2022/0336371 A1    Oct. 20, 2022

(51) Int. Cl.
*H01L 23/00* (2006.01)
*H01L 21/56* (2006.01)
*H01L 21/683* (2006.01)

(52) U.S. Cl.
CPC .......... *H01L 23/562* (2013.01); *H01L 21/561* (2013.01); *H01L 21/568* (2013.01); *H01L 21/6835* (2013.01)

(58) Field of Classification Search
CPC .................. H01L 23/562; H01L 21/561; H01L 2221/68331; H01L 21/568; H01L 21/6835
See application file for complete search history.

(56) References Cited

U.S. PATENT DOCUMENTS

| 7,950,144 | B2 | 5/2011 | Ramanathan et al. |
| 8,758,552 | B2 | 6/2014 | Canale et al. |
| 8,829,661 | B2 | 9/2014 | Lytle et al. |
| 8,832,924 | B2 | 9/2014 | Mizubata |
| 9,107,303 | B2 | 8/2015 | Lytle et al. |
| 9,420,694 | B2 | 8/2016 | Chung |
| 9,786,520 | B2 | 10/2017 | Liu et al. |
| 2006/0131746 | A1 | 6/2006 | Kohara et al. |
| 2009/0047754 | A1 | 2/2009 | Chen et al. |
| 2009/0261468 | A1 | 10/2009 | Kroeninger et al. |
| 2009/0289339 | A1 | 11/2009 | Hu et al. |
| 2011/0193237 | A1 | 8/2011 | Tian et al. |
| 2012/0139192 | A1 | 6/2012 | Ooi |

(Continued)

FOREIGN PATENT DOCUMENTS

| JP | S62149141 A | 7/1987 |
| JP | 2015079832 A | 4/2015 |
| WO | 2008018379 A1 | 2/2008 |

OTHER PUBLICATIONS

Notice of Allowance dated Apr. 19, 2022 in U.S. Appl. No. 17/209,710.
Lau, J., "Recent Advances and Trends in Fan-Out Wafer/Panel-Level Packaging", Journal of Electronic Packaging, vol. 141, Dec. 2019.
U.S. Appl. No. 17/209,710, filed Mar. 23, 2021, and entitled "Semiconductor Device Packaging Warpage Control".

(Continued)

*Primary Examiner* — Thanh T Nguyen

(57) ABSTRACT

A method of manufacturing a semiconductor device packaging panel is provided. The method includes forming a panel having an active side and a backside. The panel includes a plurality of semiconductor die encapsulated with an encapsulant. An active surface of the semiconductor die is exposed on the active side of the panel. A warpage control carrier is attached onto the backside of the panel. The warpage control carrier includes an electroactive element configured for substantially flattening the panel while a control voltage is applied to the electroactive element.

16 Claims, 17 Drawing Sheets

(56) References Cited

U.S. PATENT DOCUMENTS

| | | | |
|---|---|---|---|
| 2012/0171875 A1* | 7/2012 | Gan | H01L 21/67288 |
| | | | 257/E21.328 |
| 2013/0181336 A1 | 7/2013 | Talbot et al. | |
| 2014/0077381 A1 | 3/2014 | Lin et al. | |
| 2015/0371969 A1 | 12/2015 | Yu et al. | |
| 2016/0056055 A1* | 2/2016 | Ko | H01L 21/4853 |
| | | | 438/126 |
| 2016/0351462 A1 | 12/2016 | Kuan et al. | |
| 2017/0133358 A1 | 5/2017 | Chang et al. | |
| 2017/0338129 A1* | 11/2017 | Lin | H01L 21/561 |
| 2018/0350710 A1* | 12/2018 | Iwahashi | H01L 23/29 |
| 2019/0341356 A1 | 11/2019 | Chung et al. | |
| 2019/0364691 A1 | 11/2019 | Subrahmanyam et al. | |
| 2020/0066655 A1 | 2/2020 | Eid et al. | |
| 2021/0384043 A1* | 12/2021 | Fay | H01L 21/78 |
| 2022/0193858 A1 | 6/2022 | Deshpande et al. | |

OTHER PUBLICATIONS

U.S. Appl. No. 17/337,583, filed Jun. 3, 2021, and entitled ": Semiconductor Device Packaging Warpage Control".

Non-final office action dated Dec. 21, 2022 in U.S. Appl. No. 17/337,583.

Baozong, Z., "FEA Simulation and In-situ Warpage Monitoring of Laminated Package Molded with Green EMC Using Shadow Morie System", 2006 7th International Conference on Electronic Packaging Technology, Aug. 26-29, 2006.

Che, F.X., "Study on Warpage of Fan-Out Panel Level Packaging (FO-PLP) using Gen-3 Panel", 2019 IEEE 69th Electronic Components and Technology Conference (ECTC), May 28-31, 2019.

Final office action dated Mar. 30, 2023 in U.S. Appl. No. 17/337,583.

Non-final office action dated Aug. 31, 2023 in U.S. Appl. No. 17/337,583.

* cited by examiner

SEMICONDUCTOR DEVICE PACKAGING WARPAGE CONTROL

BACKGROUND

Field

This disclosure relates generally to semiconductor device packaging, and more specifically, to semiconductor device packaging warpage control.

Related Art

Today, many electronic products include semiconductor devices formed from panel-level packaging of semiconductor die. With panel-level packaging, connections to the semiconductor die may be formed after panel encapsulation. After encapsulation, there is a problem referred to as panel warping that can occur as an effect of the encapsulation, redistribution, or other process steps, for example. Warping is of particular concern in panel-level packaging as forming connections to the semiconductor die can be difficult thus affecting yield, reliability, costs, and panel handling through processing. Therefore, it is desirable to overcome problems associated with panel-level warpage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device packaging process and apparatus for panel warpage control. A reusable warpage control carrier includes electroactive elements configured to substantially flatten a semiconductor device packaging panel. The warpage control carrier is joined with the panel by way of a thermal releasable adhesive, for example. Control voltages are applied to the electroactive elements of the warpage control carrier to sufficiently flatten the panel to a desired flatness. With the panel substantially flattened, subsequent planar-sensitive processing layers may be applied allowing for improved yield, reliability, costs, and panel handling through processing.

Figure 1:
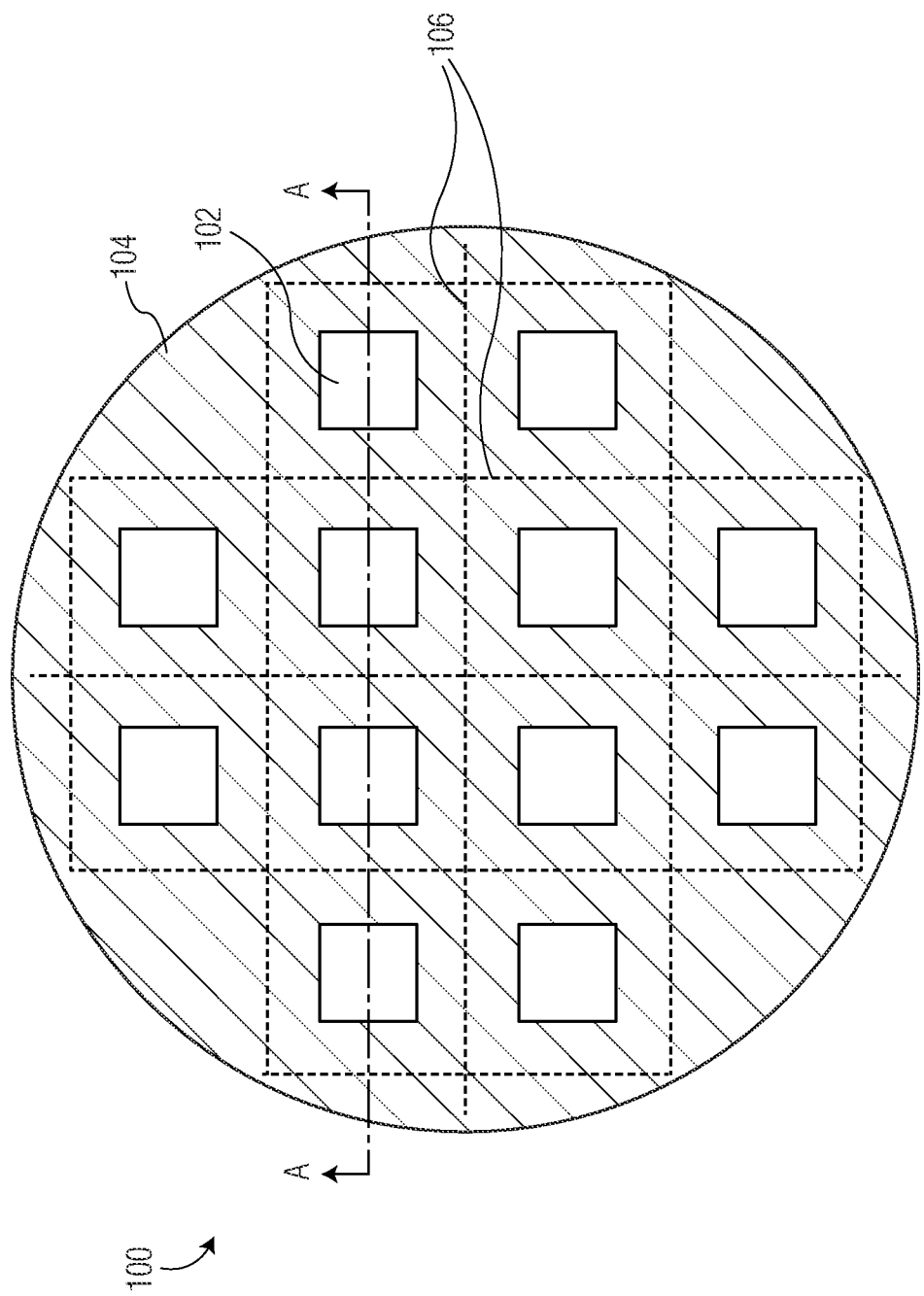
FIG. 1 illustrates, in a simplified plan view, an example semiconductor device packaging panel at a stage of manufacture in accordance with an embodiment.
Figure 2:
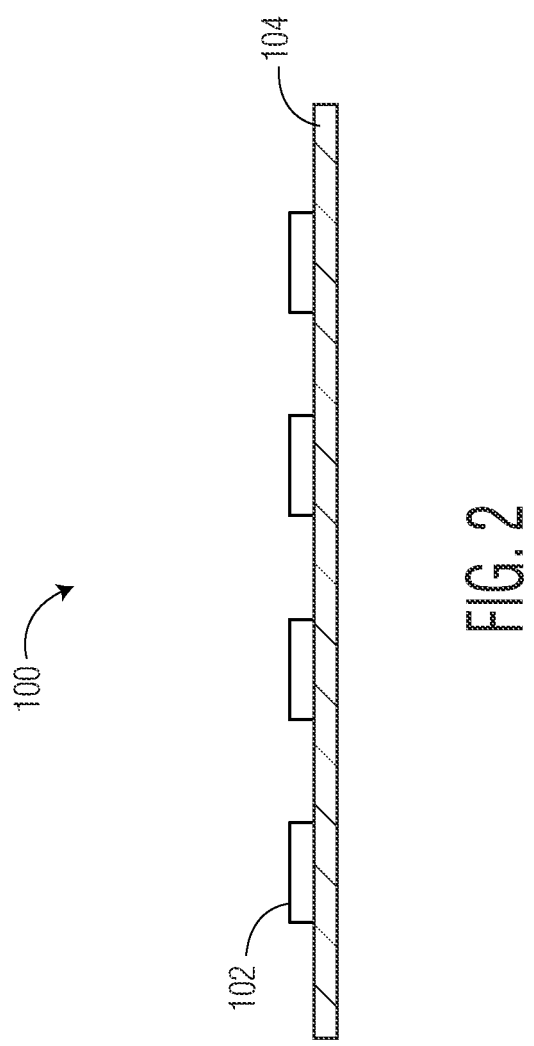
FIG. 2 through FIG. 6 illustrate, in simplified cross-sectional views, the example semiconductor device packaging panel at stages of manufacture in accordance with an embodiment.

FIG. 1 illustrates, in a simplified plan view, an example semiconductor device packaging panel 100 at a stage of manufacture in accordance with an embodiment. FIG. 2 illustrates, in a simplified cross-sectional view, the panel 100 at the stage of manufacture depicted in FIG. 1. At this stage of manufacture, the panel 100 includes a plurality of semiconductor die 102 placed on a carrier substrate 104. In this embodiment, each package site includes at least one semiconductor die 102 of the plurality. The package sites are depicted by way of predetermined singulation lanes 106 shown as dashed lines. In this embodiment, the panel 100 is depicted as a round panel having 12 package sites, for example. In other embodiments, the panel 100 may include any number of package sites and may be formed in other shapes (e.g., rectangular).

The semiconductor die 102 has an active surface (e.g., major surface having circuitry) and a backside surface (e.g., major surface opposite of the active surface). The semiconductor die 102 includes bond pads (not shown) at the active surface configured for connection to printed circuit board (PCB) by way of redistribution layer (RDL), for example. The semiconductor die 102 may be formed from any suitable semiconductor material, such as silicon, germanium, gallium arsenide, gallium nitride and the like. The semiconductor die 102 may further include any digital circuits, analog circuits, RF circuits, memory, signal processor, MEMS, sensors, the like, and combinations thereof. In addition to the semiconductor die 102, other components, devices, and/or structures may be included in the package sites such as discrete devices, embedded substrates, copper structures (e.g., embedded ground plane), and the like.

The carrier substrate 104 has a top major surface and a bottom major surface. The carrier substrate 104 is configured and arranged to provide a temporary structure for placement of semiconductor die 102 and encapsulation at a subsequent stage of manufacture. The carrier substrate 104 may be formed from any suitable material such as glass, metal, silicon wafer, or organic material. The carrier substrate 104 may be formed in any suitable shape such as round, square, or rectangular. An adhesive, double-sided tape or film, or the like (not shown) is applied to the major surface of the carrier substrate for temporary die attachment and subsequent encapsulation. In this embodiment, the semiconductor die 102 of the plurality are placed active surface down onto the top major side of the carrier substrate 104.

Figure 3:
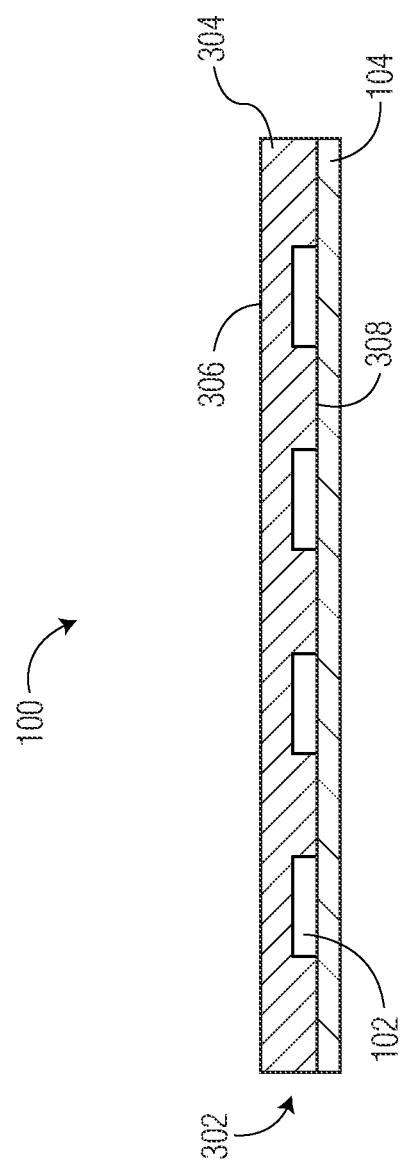

FIG. 3 illustrates, in a simplified cross-sectional view, the example semiconductor device packaging panel 100 at a subsequent stage of manufacture in accordance with an embodiment. At this stage of manufacture, the panel 100 further includes an encapsulant (e.g., epoxy material) 304 which encapsulates the plurality of semiconductor die 102 and the top side of the carrier substrate 104. In this embodiment, the semiconductor die 102 placed on the carrier substrate 104 are over-molded with the encapsulant 304 having a first major surface 306 and a second major surface 308. A post-mold flat condition 302 of panel 100 is depicted after over-molding with the encapsulant 304.

Figure 4:
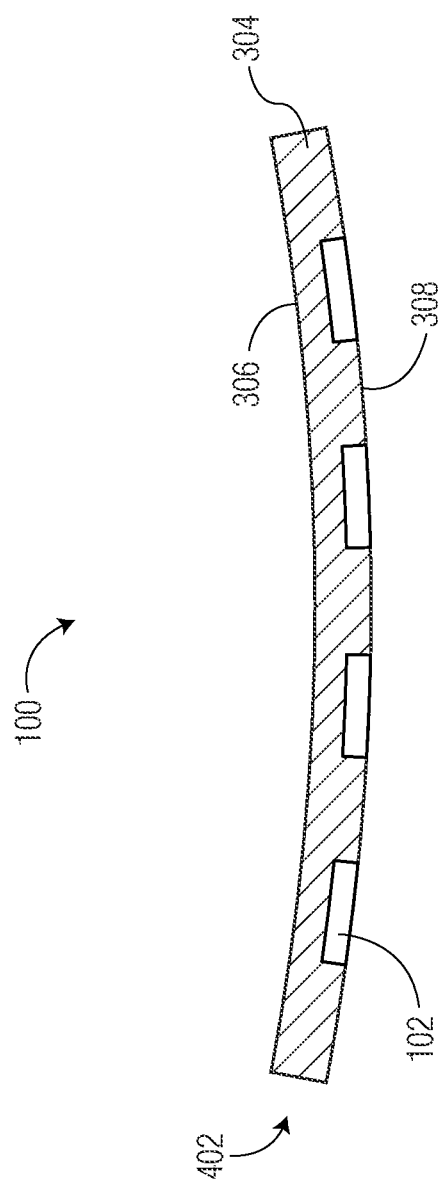

FIG. 4 illustrates, in a simplified cross-sectional view, the example semiconductor device packaging panel 100 at a subsequent stage of manufacture in accordance with an embodiment. At this stage of manufacture, the encapsulant 304 is cured and the carrier substrate (104) is removed. A post-mold warped condition 402 of panel 100 is depicted after removal from the carrier substrate (104). The warped condition 402 may result from effects of differing thermal expansion coefficients of the semiconductor die 102 and encapsulant 304 during cure, for example. With other components, devices, and/or structures included in the package sites of the panel, additional dissimilar materials having further differing thermal expansion coefficients may exacerbate the warped condition 402.

Figure 5:
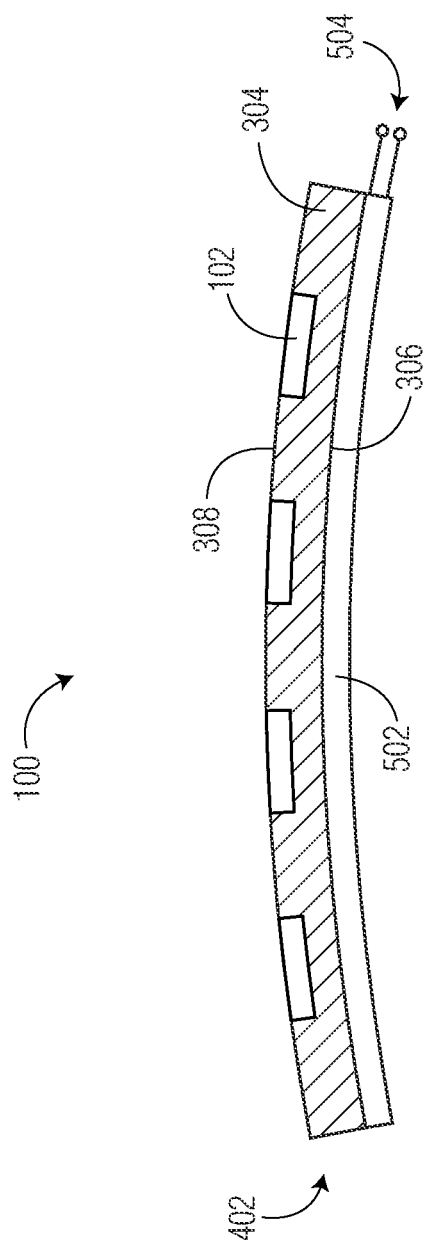

FIG. 5 illustrates, in a simplified cross-sectional view, the example semiconductor device packaging panel 100 at a subsequent stage of manufacture in accordance with an embodiment. At this stage of manufacture, the panel 100 having the warped condition 402 is oriented (e.g., flipped) and joined with a warpage control carrier 502. The warpage control carrier 502 may be attached to the backside of the panel by way of a thermal releasable adhesive (e.g., double-sided thermal tape/film, other temporary bonding interface material). In this embodiment, the warpage control carrier 502 includes an electroactive element (not shown) and an example pair of terminals 504 for electrical connection to the electroactive element. The term electroactive element, as used herein, generally refers to a flexible material which deflects in a predetermined manner based on an applied electrical stimulus (e.g., voltage). The warpage control carrier 502 may be formed from a flexible film such as a polyimide-based film having an integrated electroactive element or otherwise attached electroactive element. In this embodiment, the warpage control carrier 502 is configured for substantially flattening the panel 100 while a control voltage is applied to the electroactive element.

Figure 6:
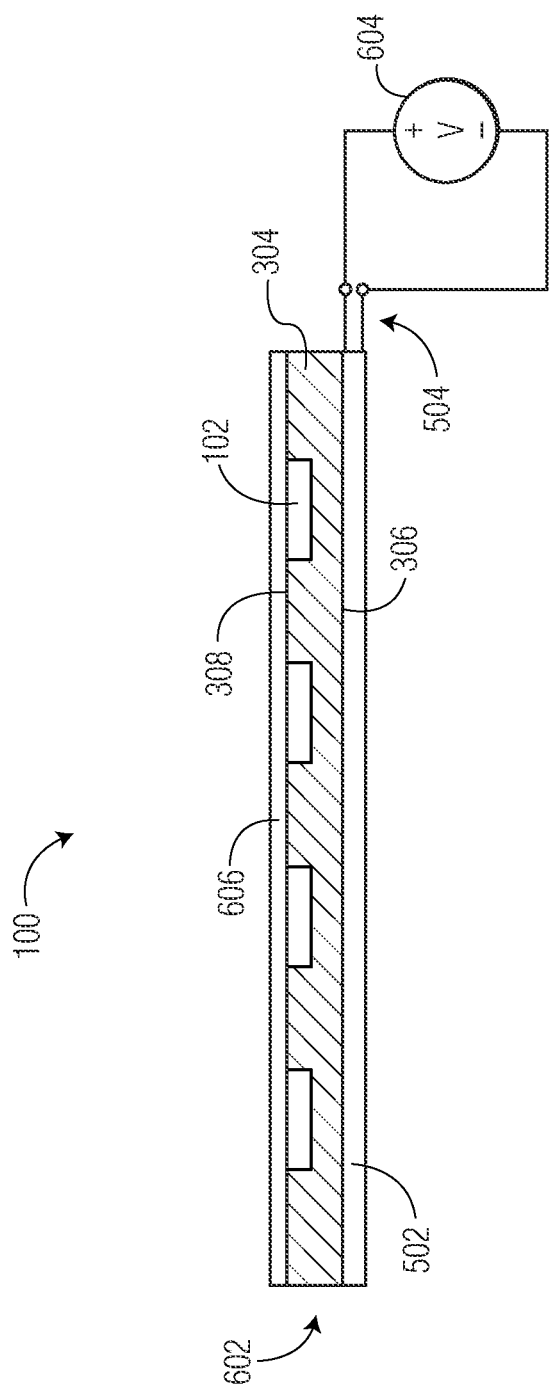

FIG. 6 illustrates, in a simplified cross-sectional view, the example semiconductor device packaging panel 100 at a subsequent stage of manufacture in accordance with an embodiment. At this stage of manufacture, a substantially flattened condition 602 of panel 100 is formed. In this embodiment, the control voltage is applied to the electroactive element of the warpage control carrier 502 to form and/or maintain the substantially flattened condition 602 of panel 100. While the panel 100 is substantially flattened, planar-sensitive processing layers (e.g., RDL) 606 are applied on the active surface of the semiconductor die 102 at the major surface 308 of the encapsulant 304.

The control voltage is provided by way of a programmable voltage source 604 connected to the terminals 504 of the warpage control carrier 502. In one embodiment, the control voltage value may be determined manually by monitoring the amount of warpage in the panel and adjusting the control voltage until a desired flattened condition is achieved. In another embodiment, a set of predetermined control voltage values may be stored in a look-up table, for example, having the control voltage applied to the electroactive element based on a value retrieved from the look-up table. In yet another embodiment, the control voltage value may be determined by way of a feedback-based control system whereby the control voltage is dynamically adjusted based on panel warpage feedback until a desired flattened condition is achieved.

Figure 7:
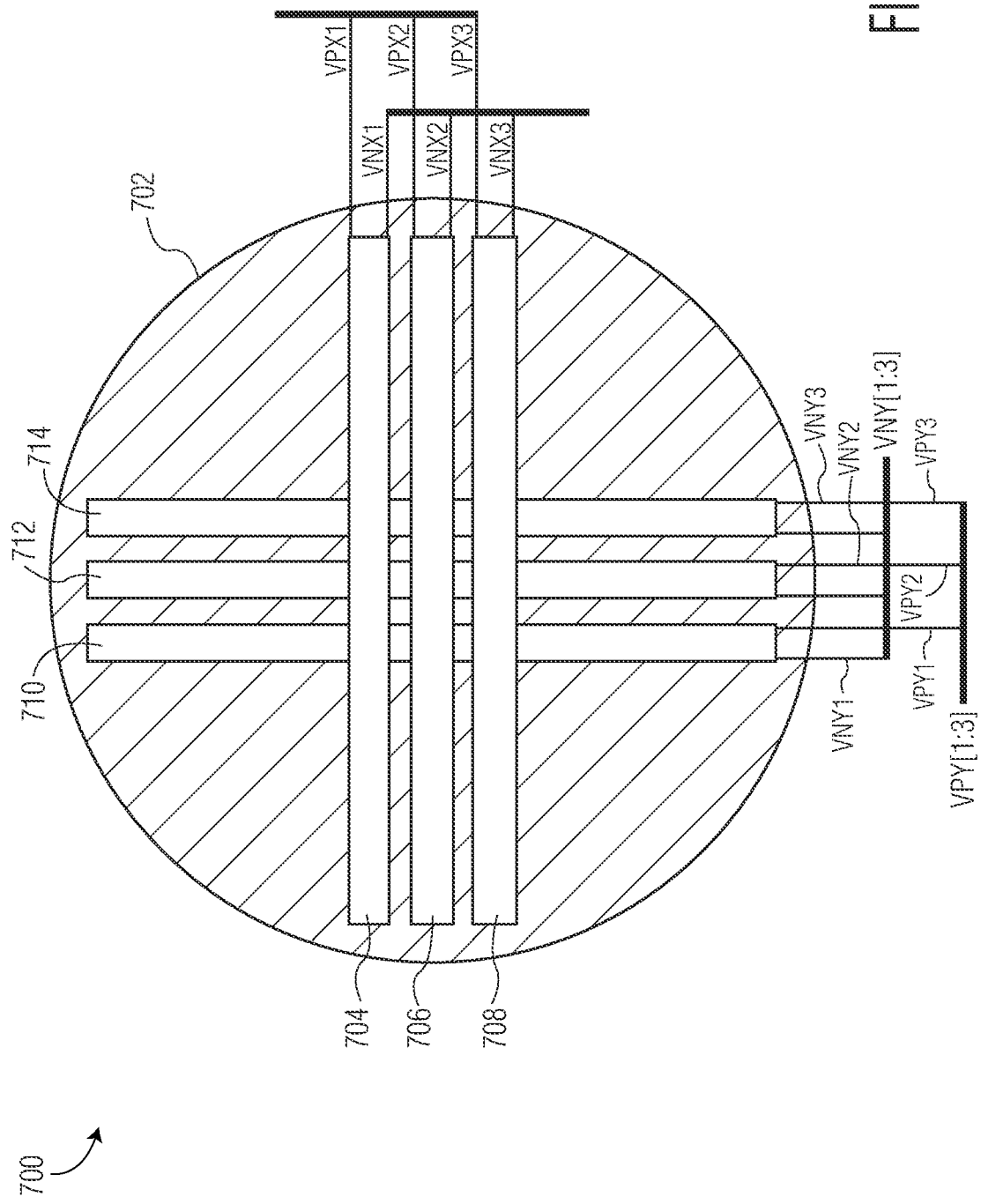
FIG. 7 and FIG. 8 illustrate, in simplified plan views, example warpage control carriers having electroactive elements in accordance with an embodiment.
Figure 8:
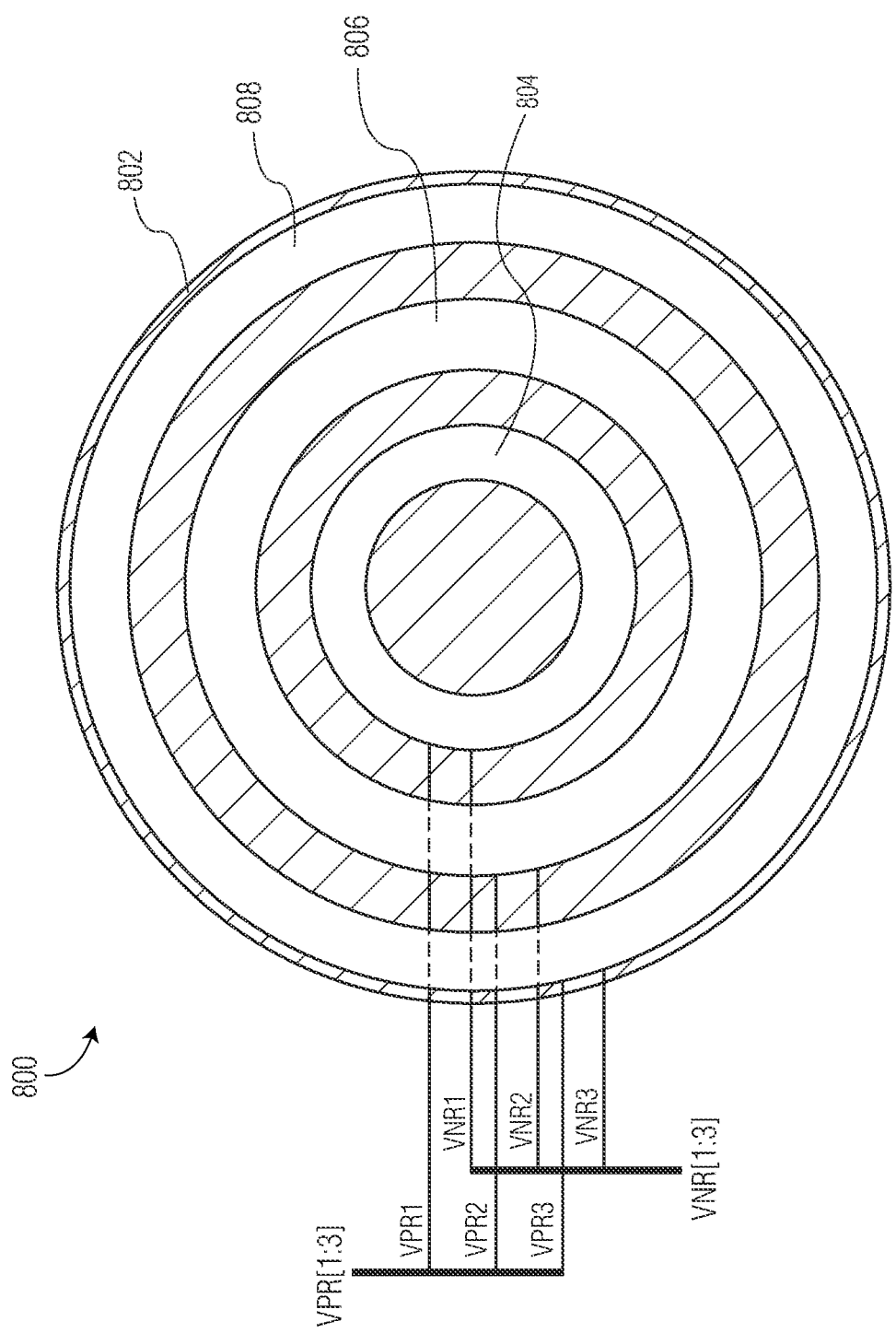

FIG. 7 and FIG. 8 illustrate, in simplified plan views, example warpage control carriers 700 and 800 having electroactive elements in accordance with embodiments. The warpage control carriers 700 and 800 are formed having a substantially round shape suitable for attachment to a substantially round panel, for example. The number of electroactive elements depicted in FIG. 7 and FIG. 8 is chosen for illustrative purposes. Embodiments of the warpage control carriers 700 and 800 may include any suitable number of electroactive elements.

In the embodiment depicted in FIG. 7, the warpage control carrier 700 includes a first set of linear strip electroactive elements 704-708 oriented orthogonally to a second set of linear strip electroactive elements 710-714 integrated onto a flexible film 702 (e.g., polyimide-based film). For example, the electroactive elements 704-708 are arranged in a horizontal orientation parallel to an X-axis and the electroactive elements 710-714 are arranged in a vertical orientation parallel to a Y-axis. Each of the electroactive elements 704-714 is individually controlled by way of a control voltage. Each of the electroactive elements 704-714 is connected to a set of control voltage signal lines for receiving the control voltage. For example, electroactive element 704 is connected to VPX1 and VNX1 control voltage signal lines, electroactive element 706 is connected to VPX2 and VNX2 control voltage signal lines, and electroactive element 708 is connected to VPX3 and VNX3 control voltage signal lines. Likewise, electroactive element 710 is connected to VPY1 and VNY1 control voltage signal lines, electroactive element 712 is connected to VPY2 and VNY2 control voltage signal lines, and electroactive element 714 is connected to VPY3 and VNY3 control voltage signal lines. Each set of control voltage signal lines (e.g., VPX1 and VNX1, VPY1 and VNY1, and so on) is configured to receive independent control voltages.

In this embodiment, the VPX[1:3] and VPY[1:3] control voltage signal lines are configured for receiving positive voltages relative to a ground voltage (ground signal lines not shown) and the VNX[1:3] and VNY[1:3] control voltage signal lines are configured for receiving negative voltages relative to the ground voltage. For example, a positive control voltage applied to an electroactive element may cause the electroactive element to deflect in a first direction and a negative control voltage applied to the electroactive element may cause the electroactive element to deflect in a second direction opposite of the first direction. By arranging the first set of electroactive elements 704-708 oriented orthogonally to the second set of electroactive elements 710-714, warpage may be selectively controlled with precision in all quadrants of the warpage control carrier 700.

In the embodiment depicted in FIG. 8, the warpage control carrier 800 includes a set of circular strip electroactive elements 804-808 arranged in a concentric manner and integrated onto a flexible film 802 (e.g., polyimide-based film). For example, the electroactive elements 804-808 are arranged in substantially circular strips, each having successively larger diameters. Each of the electroactive elements 804-808 is individually controlled by way of a control voltage. Each of the electroactive elements 804-808 is connected to a set of control voltage signal lines for receiving the control voltage. For example, electroactive element 804 is connected to VPR1 and VNR1 control voltage signal lines, electroactive element 806 is connected to VPR2 and VNR2 control voltage signal lines, and electroactive element 808 is connected to VPR3 and VNR3 control voltage signal lines. Each set of control voltage signal lines (e.g., VPR[1:3] and VNR[1:3]) is configured to receive independent control voltages.

In this embodiment, the VPR[1:3] control voltage signal lines are configured for receiving positive voltages relative to a ground voltage (ground signal lines not shown) and the VNR[1:3] control voltage signal lines are configured for receiving negative voltages relative to the ground voltage. For example, a positive control voltage applied to an electroactive element may cause the electroactive element to deflect in a first direction and a negative control voltage applied to the electroactive element may cause the electroactive element to deflect in a second direction opposite of the first direction. By arranging the set of electroactive elements 804-808 in a concentric configuration, warpage may be selectively controlled with precision in all regions of the warpage control carrier 800.

Figure 9:
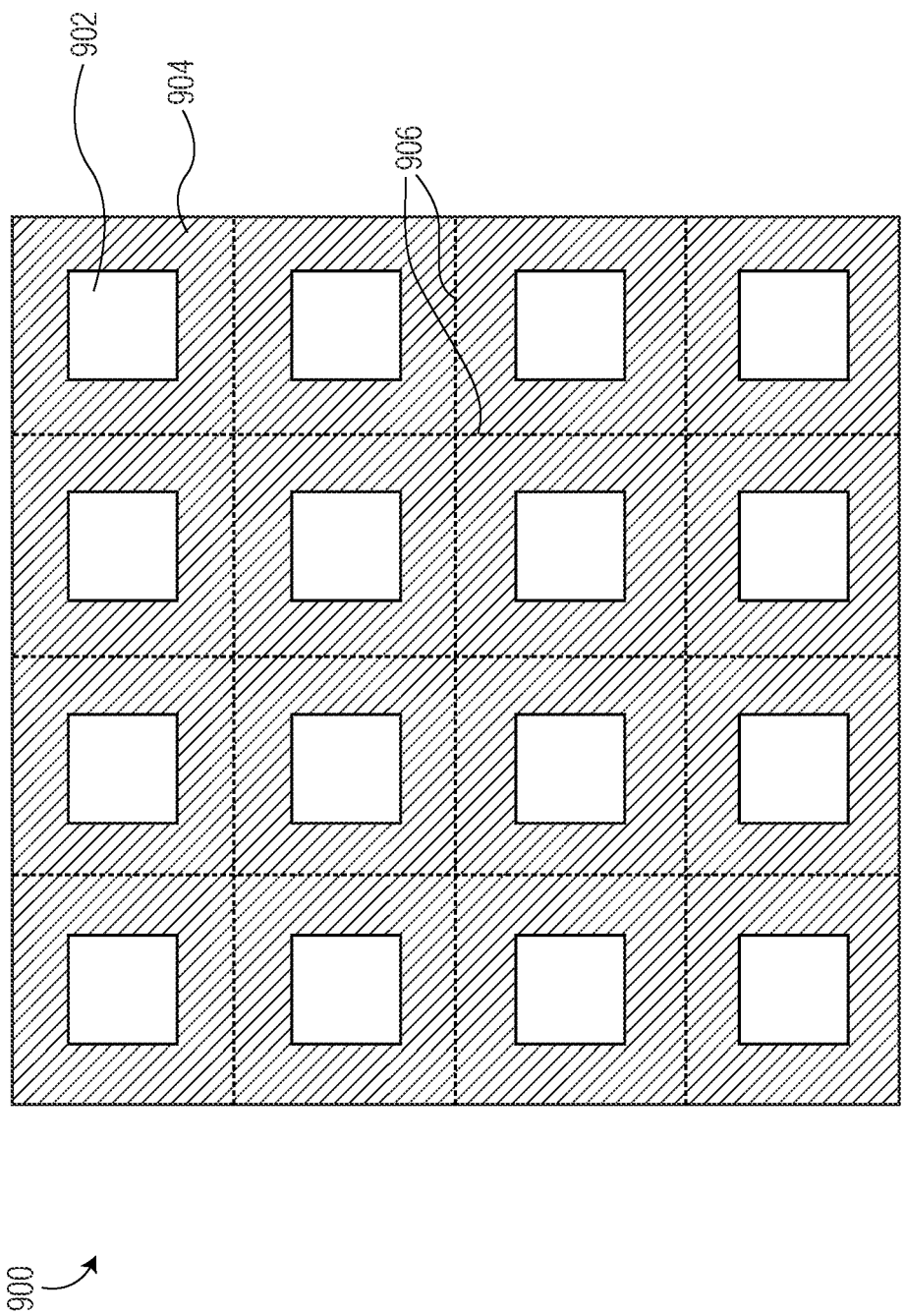
FIG. 9 illustrates, in a simplified plan view, a rectangular example semiconductor device packaging panel at a stage of manufacture in accordance with an embodiment.

FIG. 9 illustrates, in a simplified plan view, an example semiconductor device packaging panel 900 at a stage of manufacture in accordance with an embodiment. At this stage of manufacture, the panel 900 includes a plurality of semiconductor die 902 and an encapsulant (e.g., epoxy material) 904 which encapsulates the plurality of semiconductor die 902. The panel 900 is formed by placing the semiconductor die 902 on a temporary carrier substrate then over-molded with the encapsulant 904. The embodiment depicted in FIG. 9 is after removal of the carrier substrate with an active surface of the semiconductor die 902 exposed and facing upward. In this embodiment, each package site includes at least one semiconductor die 902 of the plurality. The package sites are depicted by way of predetermined singulation lanes 906 shown as dashed lines. In this embodiment, the panel 900 is depicted as a rectangular panel having 16 package sites, for example. In other embodiments, the panel 900 may include any number of package sites.

The semiconductor die 902 included in the package sites may be formed from any suitable semiconductor material, such as silicon, germanium, gallium arsenide, gallium nitride and the like. The semiconductor die 902 may further include any digital circuits, analog circuits, RF circuits, memory, signal processor, MEMS, sensors, the like, and combinations thereof. In addition to the semiconductor die 902, other components, devices, and/or structures may be included in the package sites such as discrete devices, embedded substrates, copper structures (e.g., embedded ground plane), and the like.

At this stage of manufacture, panel 900 may include a post-mold warped condition after removal from the carrier substrate. The warped condition may result from effects of differing thermal expansion coefficients of the semiconductor die 902 and encapsulant 904 during cure, for example. With other components, devices, and/or structures included in the package sites of the panel, additional dissimilar materials having further differing thermal expansion coefficients may exacerbate the warped condition.

Figure 10:
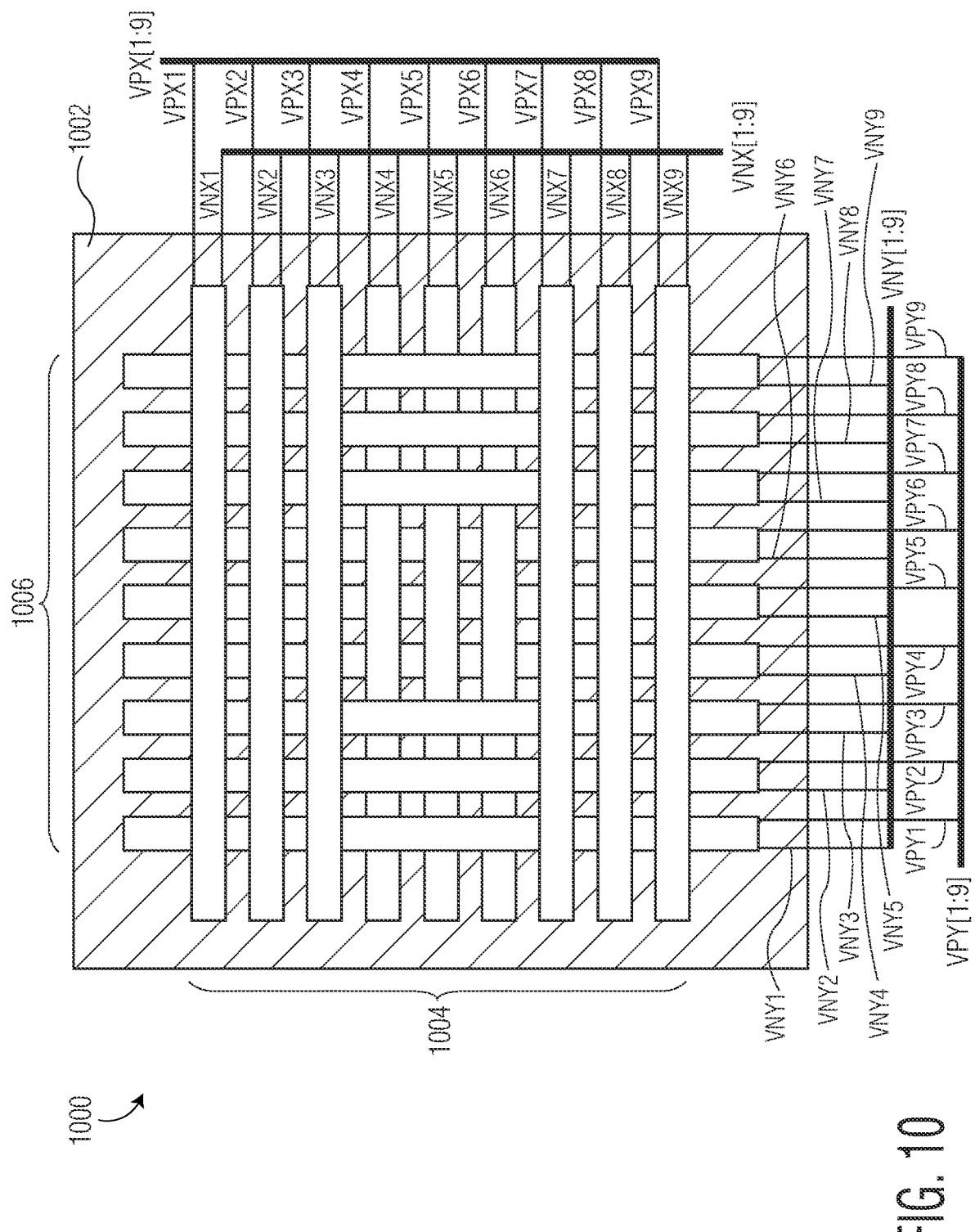
FIG. 10 illustrates, in a simplified plan view, a rectangular example warpage control carrier having electroactive elements in accordance with an embodiment.

FIG. 10 illustrates, in a simplified plan view, an example warpage control carrier 1000 having electroactive elements in accordance with an embodiment. The warpage control carrier 1000 is formed having a substantially rectangular shape suitable for attachment to a substantially rectangular panel, for example. The number of electroactive elements and arrangement depicted in FIG. 10 are chosen for illustrative purposes. Embodiments of the warpage control carrier 1000 may include any suitable number of electroactive elements and configuration thereof. Because of the larger number of electroactive elements integrated with the warpage control carrier 1000, panel warpage may be controlled with higher precision.

In the embodiment depicted in FIG. 10, the warpage control carrier 1000 includes a first set of linear strip electroactive elements 1004 oriented orthogonally to a second set of linear strip electroactive elements 1006 integrated onto a flexible film 1002 (e.g., polyimide-based film). For example, the electroactive elements 1004 are arranged in a horizontal orientation parallel to an X-axis and the electroactive elements 1006 are arranged in a vertical orientation parallel to a Y-axis. In this embodiment, a portion of the electroactive elements 1004 is interlaced with a portion of the electroactive elements 1006 to form a simple weave pattern. Each of the electroactive elements 1004 and 1006 is individually controlled by way of a control voltage. Each of the electroactive elements 1004 and 1006 is connected to a set of control voltage signal lines for receiving the control voltage. For example, each electroactive element of the first set of electroactive elements 1004 is connected to respective VPX[1:9] and VNX[1:9] control voltage signal lines, and each electroactive element of the second set of electroactive elements 1006 is connected to respective VPY[1:9] and VNY[1:9] control voltage signal lines. Each set of control voltage signal lines (e.g., VPX1 and VNX1, VPY1 and VNY1, and so on) is configured to receive independent control voltages.

In this embodiment, the VPX[1:9] and VPY[1:9] control voltage signal lines are configured for receiving positive voltages relative to a ground voltage (ground signal lines not shown) and the VNX[1:9] and VNY[1:9] control voltage signal lines are configured for receiving negative voltages relative to the ground voltage. For example, a positive control voltage applied to an electroactive element may cause the electroactive element to deflect in a first direction and a negative control voltage applied to the electroactive element may cause the electroactive element to deflect in a second direction opposite of the first direction. By arranging the first set of electroactive elements 1004 oriented orthogonally to the second set of electroactive elements 1006, warpage may be selectively controlled in all regions of the warpage control carrier 1000.

Figure 11:
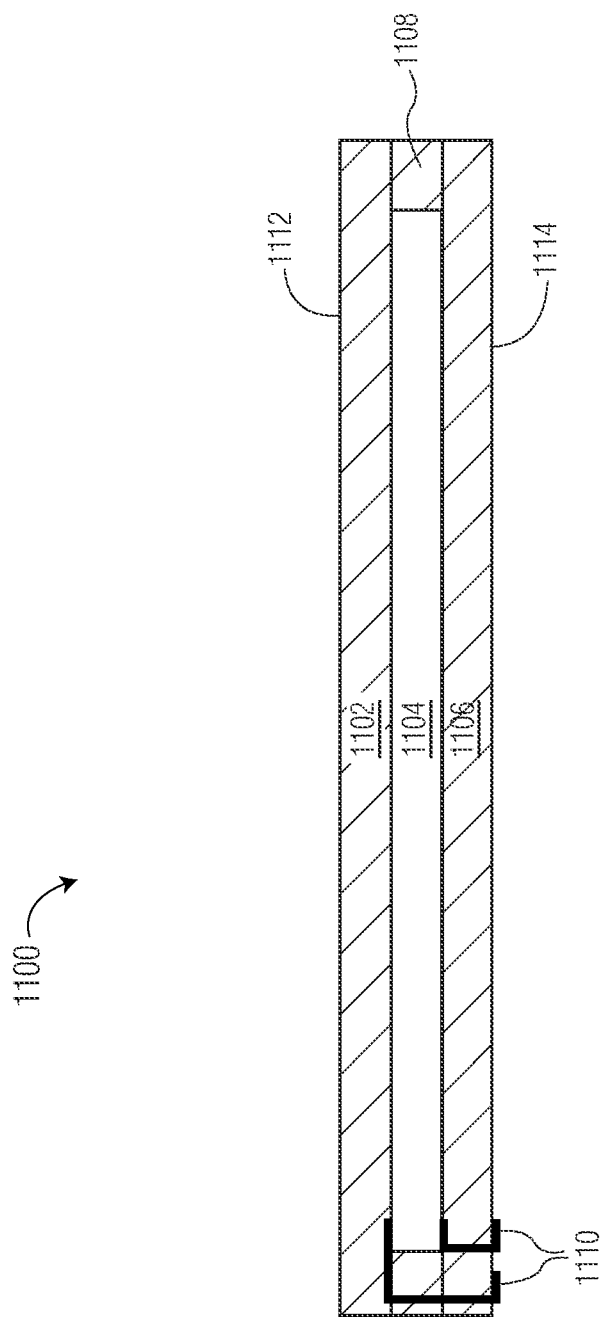
FIG. 11 illustrates, in a simplified cross-sectional view, an example warpage control carrier having electroactive elements in accordance with an embodiment.

FIG. 11 illustrates, in a simplified cross-sectional view, an example warpage control carrier 1100 having electroactive elements 1104 in accordance with an embodiment. In this embodiment, the warpage control carrier 1100 includes electroactive elements 1104 integrated onto a flexible film layer 1108 and sandwiched between a top flexible film layer 1102 and a bottom flexible film layer 1106. Each of the flexible film layers may be formed from a polyimide-based film or other suitable film.

The top flexible film layer 1102 of the warpage control carrier 1100 is configured for attachment to a panel. For example, a thermal releasable adhesive (e.g., double-sided thermal tape/film, other temporary bonding interface material) may be applied at the top surface 1112 of the film layer 1102 for attaching the warpage control carrier 1100 to the panel. In some embodiments, the film layer 1102 may include integrated sensor elements (e.g., strain gauge elements) or otherwise attached sensor elements for monitoring and/or providing an indication of an amount of panel warpage.

The bottom flexible film layer 1106 is configured to provide interconnect to the electroactive elements 1104. Example connectors 1110 depicted in FIG. 11 have a first end connected to the electroactive elements 1104 and a second end exposed through the outer surface 1114 of the bottom flexible film layer 1106. The exposed portions of connectors 1110 may be configured to receive control voltages sufficient to substantially flatten the panel while attached to a chuck (e.g., holder) of a processing apparatus, for example. With the panel sufficiently flattened while secured to the chuck, the panel may be subjected to planar-sensitive processing steps (e.g., formation of a redistribution layer) by the processing apparatus.

Figure 12:
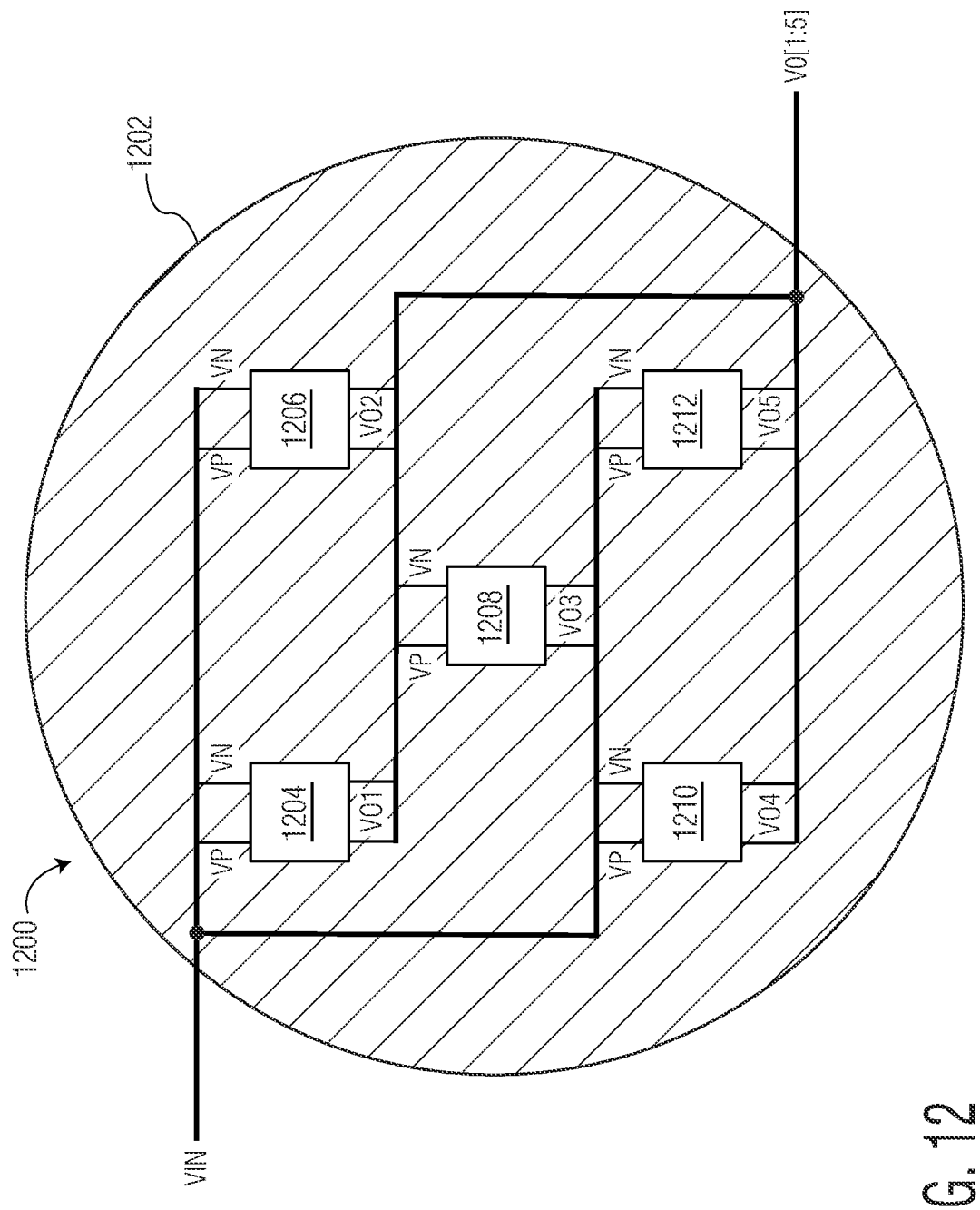
FIG. 12 and FIG. 13 illustrate, in simplified plan views, example warpage control carriers having sensor elements in accordance with an embodiment.
Figure 13:
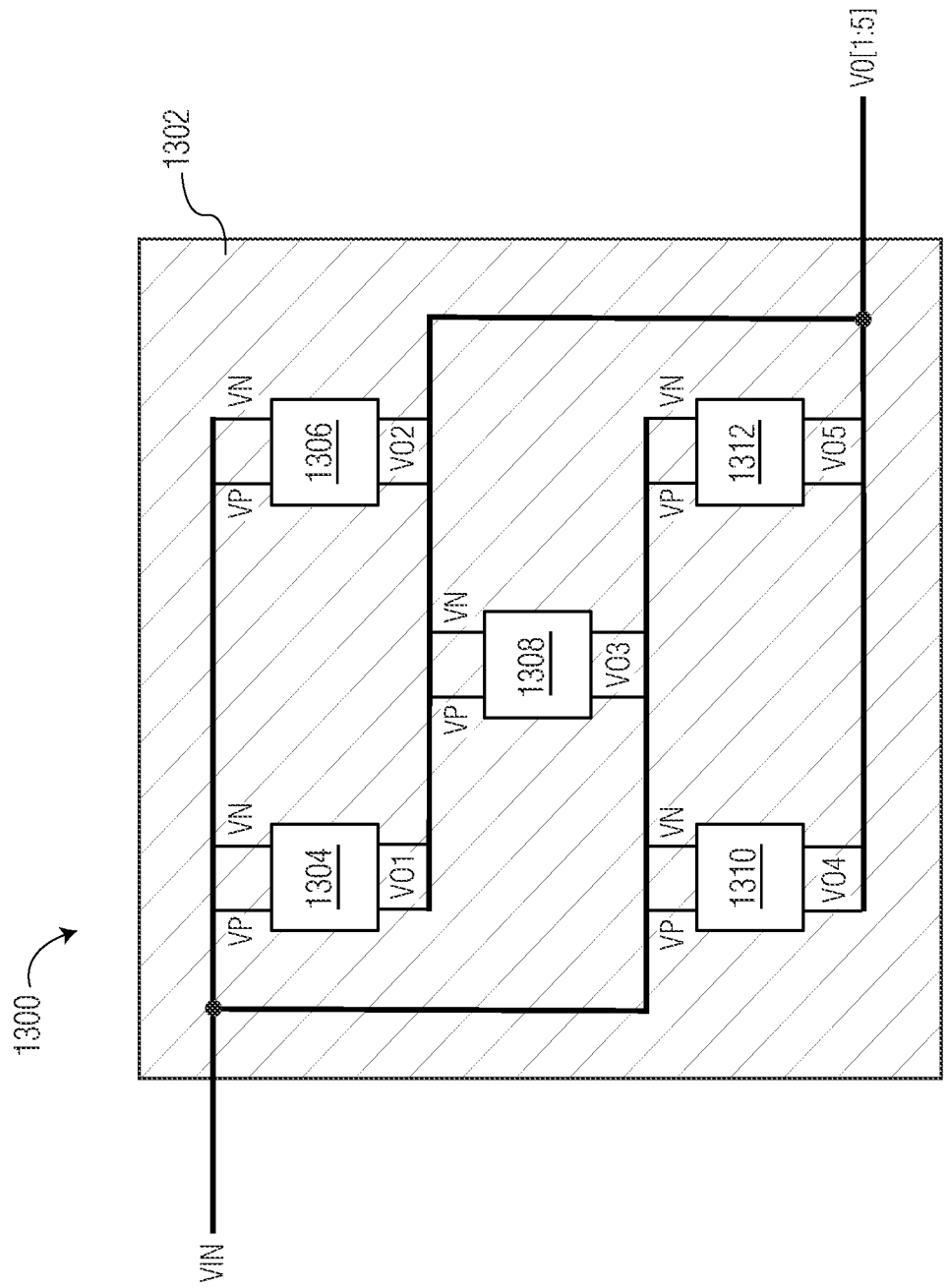

FIG. 12 and FIG. 13 illustrate, in simplified plan views, example flexible film layers 1202 and 1302 of respective warpage control carriers 1200 and 1300 having sensor elements in accordance with embodiments. The flexible film layers 1202 and 1302 may correspond to the top flexible film layer 1102 of the warpage control carrier 1100 as depicted in FIG. 11, for example. In this embodiment, the sensor elements 1204-1212 and 1304-1312 of respective FIG. 12 and FIG. 13 are characterized as strain gauge elements configured for providing output voltages (e.g., VO[1:5]) indicative of amounts of panel warpage. The number and location of sensor elements depicted in FIG. 12 and FIG. 13 are chosen for illustrative purposes. Embodiments of the warpage control carriers 1200 and 1300 may include any suitable number of sensor elements.

In the embodiment depicted in FIG. 12, the warpage control carrier 1200 is formed having a substantially round shape suitable for attachment to a substantially round panel, for example. The flexible film layer 1202 of the warpage control carrier 1200 includes a set of sensor elements 1204-1212 integrated or otherwise attached in predetermined regions of the film layer 1202. For example, considering a Cartesian coordinate perspective, the sensor element 1208 is located at the center (e.g., origin), the sensor element 1206 is located at quadrant I, the sensor element 1204 is located at quadrant II, the sensor element 1210 is located at quadrant III, and the sensor element 1212 is located at quadrant IV. In other embodiments, other desired numbers of sensor elements and locations thereof may be incorporated in the flexible film layer 1202 of the warpage control carrier 1200.

In the embodiment depicted in FIG. 13, the warpage control carrier 1300 is formed having a substantially rectangular shape suitable for attachment to a substantially rectangular panel, for example. The flexible film layer 1302 of the warpage control carrier 1300 includes a set of sensor elements 1304-1312 integrated or otherwise attached in predetermined regions of the film layer 1302. Considering a Cartesian coordinate perspective, the sensor element 1308 is located at the center (e.g., origin), the sensor element 1306 is located at quadrant I, the sensor element 1304 is located at quadrant II, the sensor element 1310 is located at quadrant III, and the sensor element 1312 is located at quadrant IV. In other embodiments, other desired numbers of sensor elements and locations thereof may be incorporated in the flexible film layer 1302 of the warpage control carrier 1200.

Each of the sensor elements 1204-1212 and 1304-1312 is configured to receive an operating voltage VIN by way of a voltage signal lines VP and VN, and in turn, provide an independent output voltages (e.g., VO[1:5]). In operation, each of the independent output voltages VO[1:5] may provide an indication of panel warpage. For example, when an output voltage of a respective sensor element exceeds a predetermined voltage threshold (e.g., minimum, maximum), an amount of panel warpage may be indicated at the respective sensor's location (e.g., quadrant).

Figure 14:
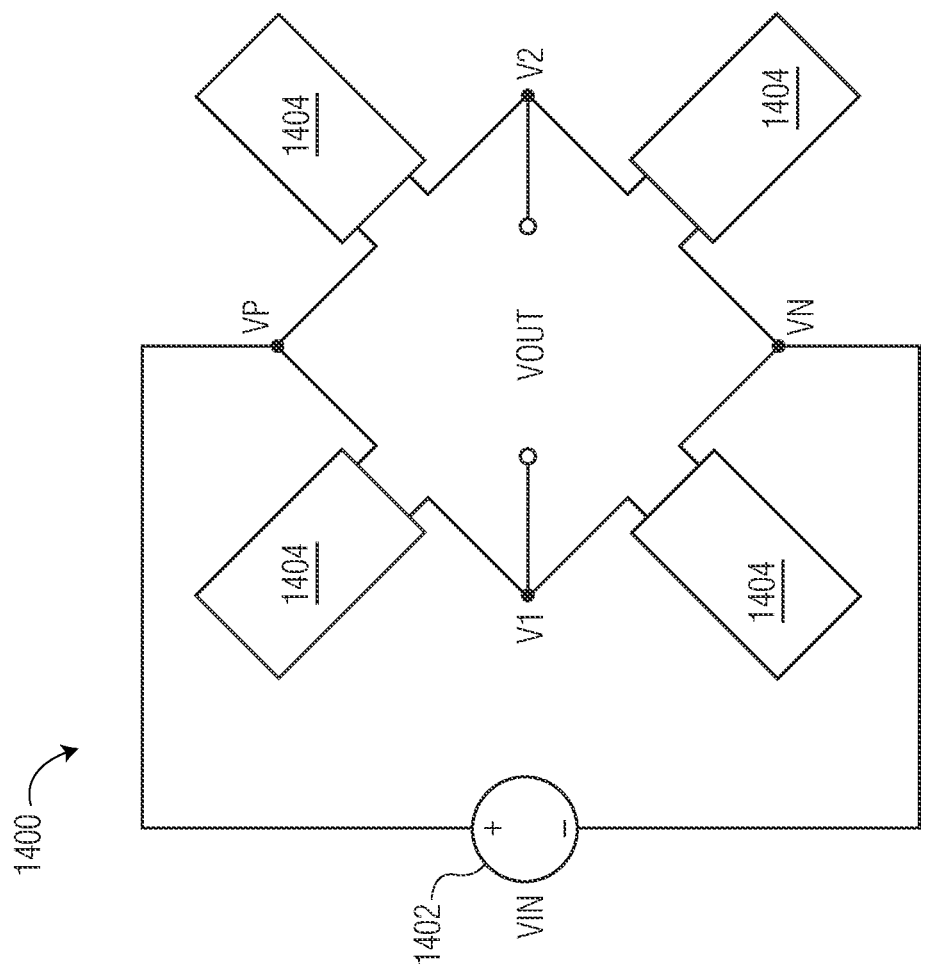
FIG. 14 illustrates, in a simplified schematic view, an example strain gauge element in accordance with an embodiment.

FIG. 14 illustrates, in a simplified schematic view, an example strain gauge element 1400 in accordance with an embodiment. In this embodiment, the strain gauge element 1400 (e.g., piezoresistive sensor) is connected to a voltage supply 1402 labeled VIN. The strain gauge element 1400 includes strain resistive units 1404 arranged in a Wheatstone bridge configuration, The strain gauge element 1400 further includes inputs labeled VP and VN for receiving the VIN voltage and outputs terminals at nodes labeled V1 and V2 for providing an output voltage VOUT, for example. Each strain resistive unit 1404 is configured to have a resistance value which varies based on an amount of strain (e.g., warpage).

Figure 15A:
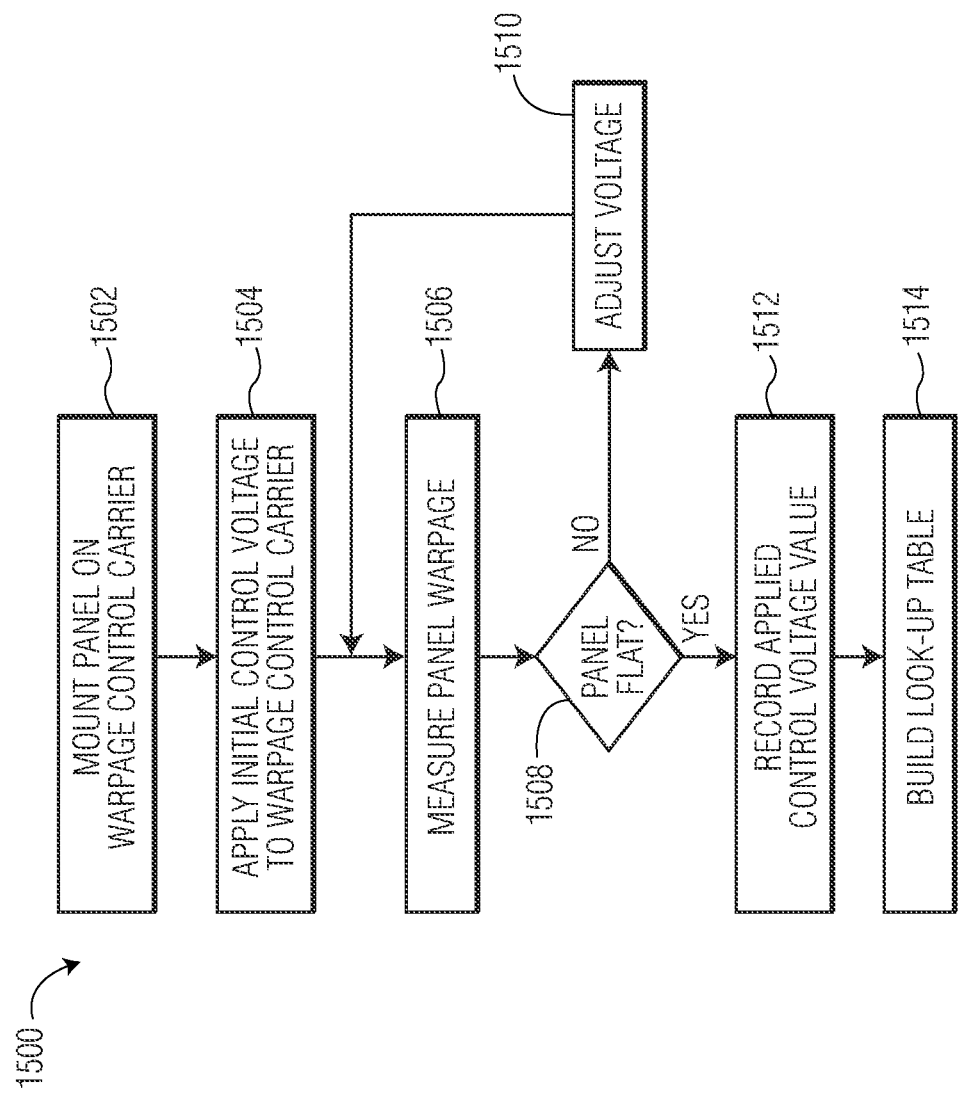
FIGS. 15A-B and FIG. 16 illustrate, in simplified flow diagram form, example methods of manufacturing a semiconductor device packaging panel in accordance with embodiments.
Figure 15B:
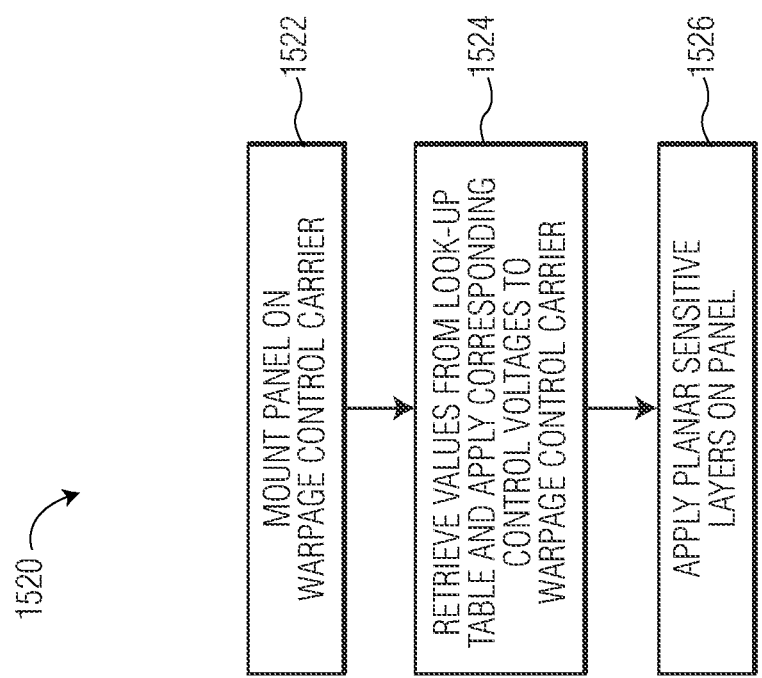
Figure 16:
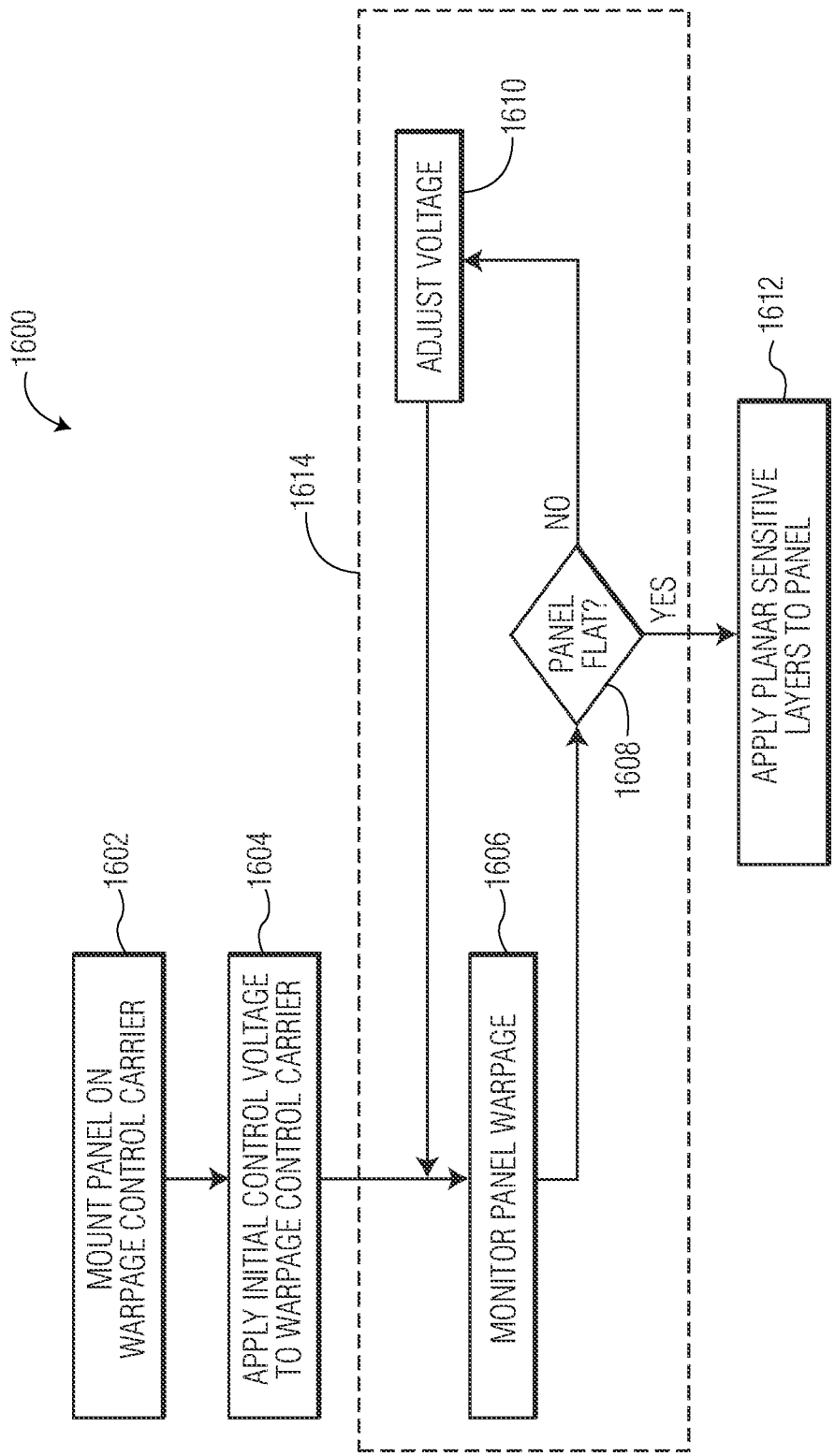

FIGS. 15A-B and FIG. 16 illustrate, in simplified flow diagram form, example methods of manufacturing a semiconductor device packaging panel in accordance with embodiments. In an example characterization flow portion 1500 (e.g., steps 1502-1514 of FIG. 15A), control voltage values sufficient to substantially flatten one or more panels are recorded and stored in a look-up table. The stored control voltage values may be based on amounts of warpage measured from samples during a packaging production run, for example. In a subsequent example production flow portion 1520 (e.g., steps 1522-1526 of FIG. 15B), control voltage values are retrieved from the look-up table and respective control voltages are applied to corresponding electroactive elements to substantially flatten panels. While each panel is substantially flattened, planar-sensitive layers may be applied. In some embodiments, the control voltages may be adjusted to maintain a desired flatness as planar-sensitive layers are applied.

At step 1502, mount a semiconductor device packaging panel on a warpage control carrier having a plurality of electroactive elements. At this step, the panel is joined with the warpage control carrier by way of a thermal releasable adhesive, for example.

At step 1504, apply an initial control voltage to the electroactive elements of the warpage control carrier. At this step, the electroactive elements of the warpage control carrier are connected to a power supply and enabled with an initial control voltage. The initial control voltage may be zero volts or other suitable voltage. For example, it may be desirable to enable the electroactive elements with an initial control voltage such that subsequent adjustments to the control voltage are minimized.

At step 1506, measure panel warpage. At this step, panel warpage may be measured or otherwise determined in one or more regions of the panel. Warpage measurement techniques such as those including laser scanning, optical scanning, and the like may be employed to monitor and determine amounts of panel warpage. Alternatively, sensors integrated within the warpage control carrier may be employed to monitor and determine amounts of panel warpage.

At step 1508, determine whether the panel is sufficiently flat. If the measured panel warpage exceeds a predetermined threshold, then (NO) proceed at step 1510. For example, the predetermined threshold may be based on a minimal or allowable amount of panel warpage whereby subsequent planar-sensitive processing layers (e.g., RDL) may be applied without impact to yield. If the measured panel warpage is within the predetermined threshold, then (YES) proceed at step 1512.

At step 1510, adjust control voltage applied to the electroactive element of the warpage control carrier. At this step, the control voltage applied to the electroactive element is incremented (e.g., increased or decreased by a voltage increment) to further flatten the panel. After the control voltage is adjusted, the flow continues at step 1506 where the panel warpage is measured again.

At step 1512, record applied control voltage values. After determining that the measured panel warpage amount is within the predetermined threshold, record the control voltage values corresponding to the control voltages applied to the electroactive elements of the warpage control carrier that substantially flattened the panel. Control voltage values may be recorded for each electroactive element and for respective amounts of warpage overcome at various regions of the panel.

At step 1514, build a look-up table including recorded applied control voltage values sufficient to substantially flatten one or more panels. At this step, the recorded control voltage values are stored in the look-up table. The stored control voltage values may be in the form of control voltage values corresponding to an amount of panel warpage offset in each region of the panel, for example. The control voltage values in the look-up table may be characteristic of substantially flattened panel samples from a production run which may be retrieved and useful in flattening other panels in the same production run.

In the subsequent example production flow portion 1520, control voltage values are retrieved from the look-up table and corresponding control voltages are applied to respective electroactive elements of the warpage control carrier to substantially flatten panels. For example, in a given production run, like components, materials, and processes are used to form the semiconductor device packaging panels. Accordingly, each panel may exhibit similar warpage characteristics. When the look-up table includes control voltage values recorded from samples of the production run, the control voltage values may be retrieved from the look-up table and used to substantially flatten subsequent panels of the production run.

At step 1522, mount a semiconductor device packaging panel on a warpage control carrier having a plurality of electroactive elements. At this step, the panel is joined with the warpage control carrier by way of a thermal releasable adhesive, for example.

At step 1524, retrieve values from the look-up table and apply corresponding control voltages to the warpage control carrier. At this step, the look-up table includes recorded control voltage values characteristic of substantially flattened panel samples from a production run or pilot production run, for example. The stored control voltage values are retrieved from the look-up table. Control voltages corresponding to the retrieved control voltage values are applied to the electroactive elements of the warpage control carrier to form substantially flatten panels.

At step 1526, apply planar-sensitive layers on the panels. At this step, with control voltages applied to the electroactive elements of the warpage control carrier, a substantially flattened condition of the panels is formed and maintained. While each panel is substantially flattened, planar-sensitive processing layers (e.g., RDL) are applied on the panel.

In an alternative example production flow 1600 (e.g., steps 1602-1612 of FIG. 16), the control voltages are applied to a warpage control carrier by way of a control system 1614. For example, the control system 1614 is configured to actively monitor panel warpage and provide output signals for adjusting respective control voltages to substantially flatten the panel in a closed-loop feedback manner. Utilizing the control system 1614 allows the flattening process to be significantly automated. While the panel is substantially flattened, planar-sensitive layers may be applied. In some embodiments, the control voltages may be adjusted to maintain a desired flatness as planar-sensitive layers are applied.

At step 1602, mount a semiconductor device packaging panel on a warpage control carrier having a plurality of electroactive elements. At this step, the panel is joined with the warpage control carrier by way of a thermal releasable adhesive, for example.

At step 1604, apply an initial control voltage to the electroactive elements of the warpage control carrier. At this step, the electroactive elements of the warpage control carrier are connected to a programmable power supply and enabled with an initial control voltage. The initial control voltage may be zero volts or other suitable voltage. For example, it may be desirable to enable the electroactive elements with an initial control voltage such that subsequent adjustments to the control voltage are minimized.

At step 1606, monitor panel warpage. At this step, a panel warpage monitor is configured to monitor panel warpage in real-time. Sensor elements such as strain gauge elements employed within the warpage control carrier are configured for providing output voltages indicative of amounts of panel warpage. The warpage monitor output voltages are used to adjust control voltages applied to the warpage control carrier in a feedback configuration based on whether the monitored panel is sufficiently flattened.

At step 1608, determine whether the panel is sufficiently flat. If the monitored panel exhibits warpage exceeding a predetermined threshold, then (NO) continue to feedback monitor output voltages to adjust control voltages at step 1610. For example, the predetermined threshold may be based on a minimal or allowable amount of panel warpage whereby subsequent planar-sensitive processing layers (e.g., RDL) may be applied without impact to yield. If the measured panel warpage is within the predetermined threshold, then (YES) proceed at step 1612.

At step 1610, based on the warpage monitor output voltages, adjust control voltages applied to the electroactive elements of the warpage control carrier. At this step, the control voltage applied to the electroactive element is increased or decreased based on the warpage monitor output voltages. After control voltages are adjusted, the panel warpage monitor continues to monitor panel warpage at step 1606.

At step 1612, apply planar-sensitive layers on the panels. At this step, with control voltages applied to the electroactive elements of the warpage control carrier, a substantially flattened condition of the panels is formed and maintained. While each panel is substantially flattened, planar-sensitive processing layers (e.g., RDL) are applied on the panel.

Generally, there is provided, a method of manufacturing a semiconductor device packaging panel including forming a panel having an active side and a backside, the panel including a plurality of semiconductor die encapsulated with an encapsulant, an active surface of the semiconductor die exposed on the active side of the panel; and attaching a warpage control carrier onto the backside of the panel, the warpage control carrier including a first electroactive element configured for substantially flattening the panel while a first control voltage is applied to the first electroactive element. The method may further include forming a planar-sensitive layer over the plurality of semiconductor die at the active side of the panel while the panel is substantially flattened on the warpage control carrier. The warpage control carrier may further include a sensor element configured to provide an output voltage indicative of panel warpage while the warpage control carrier is attached to the backside of the panel. The first control voltage applied to the first electroactive element may be based on the output voltage of the sensor element. The sensor element may be characterized as a strain gauge element configured to provide the output voltage. The first electroactive element of the warpage control carrier may be in the form of a linear strip or a circular strip. The warpage control carrier may further include a second electroactive element configured to receive a second control voltage, the first electroactive element located in a first region of the warpage control panel and the second electroactive element located in a second region of the warpage control panel. The warpage control carrier may be further configured for substantially flattening the panel while the first control voltage is applied to the first electroactive element and the second control voltage is applied to the second electroactive element. The first electroactive element located in the first region of the warpage control panel may be oriented orthogonal to the second electroactive element located in the second region of the warpage control panel.

In another embodiment, there is provided, a method of manufacturing a semiconductor device packaging panel including forming a panel having an active side and a backside, the panel including placing a plurality of semiconductor die on a first side of a carrier substrate; encapsulating with an encapsulant the plurality semiconductor die and exposed portions of the first side of the carrier substrate; attaching a warpage control carrier onto the backside of the panel, the warpage control carrier including a first electroactive element; and applying a first control voltage to the first electroactive element of the warpage control carrier to substantially flatten the panel. The method may further include forming a planar-sensitive layer over the plurality of semiconductor die at the active side of the panel while the panel is substantially flattened on the warpage control carrier. The warpage control carrier may further include a sensor element configured to provide an output voltage indicative of panel warpage while the warpage control carrier is attached to the backside of the panel. The first control voltage applied to the first electroactive element may be based on the output voltage of the sensor element. The first control voltage applied to the first electroactive element may be derived from a look-up table. The warpage control carrier may further include a second electroactive element located in a region of the warpage control panel substantially different from the first electroactive element, and wherein the panel is substantially flattened while the first control voltage is applied to the first electroactive element and a second control voltage is applied to the second electroactive element. The forming the panel may further include removing the carrier substrate after encapsulating with an encapsulant to expose the active side of the panel.

In yet another embodiment, there is provided, an apparatus for manufacturing a semiconductor device packaging panel including a warpage control carrier configured to substantially flatten a panel while attached to the panel, the warpage control carrier including an electroactive element configured for substantially flattening the panel while a control voltage is applied to the electroactive element. The warpage control carrier may include a strain gauge element configured for providing an output voltage indicative of panel warpage while the warpage control carrier is attached to the panel. The control voltage applied to the electroactive element may be based on the output voltage of the strain gauge. The warpage control carrier may further include a film formed over the electroactive element, the strain gauge integrated in the film, the film configured for attachment to the panel by way of a thermal releasable adhesive.

By now, it should be appreciated that there has been provided a semiconductor device packaging process and apparatus for panel warpage control. A reusable warpage control carrier includes electroactive elements configured to substantially flatten a semiconductor device packaging panel. The warpage control carrier is joined with the panel by way of a thermal releasable adhesive, for example. Control voltages are applied to the electroactive elements of the warpage control carrier to sufficiently flatten the panel to a desired flatness. With the panel substantially flattened, subsequent planar-sensitive processing layers may be applied allowing for improved yield, reliability, costs, and panel handling through processing.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an" The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a semiconductor device packaging panel, the method comprising:
    forming a panel having an active side and a backside, the panel including a plurality of semiconductor die encapsulated with an encapsulant, an active surface of the semiconductor die exposed on the active side of the panel; and
    attaching a warpage control carrier onto the backside of the panel, the warpage control carrier including a first electroactive element configured for substantially flattening the panel while a first control voltage is applied to the first electroactive element.

2. The method of claim 1, further comprising forming a planar-sensitive layer over the plurality of semiconductor die at the active side of the panel while the panel is substantially flattened on the warpage control carrier.

3. The method of claim 1, wherein the warpage control carrier further includes a sensor element configured to provide an output voltage indicative of panel warpage while the warpage control carrier is attached to the backside of the panel.

4. The method of claim 3, wherein the first control voltage applied to the first electroactive element is based on the output voltage of the sensor element.

5. The method of claim 3, wherein the sensor element is characterized as a strain gauge element configured to provide the output voltage.

6. The method of claim 1, wherein the first electroactive element of the warpage control carrier is in the form of a linear strip or a circular strip.

7. The method of claim 1, wherein the warpage control carrier further includes a second electroactive element configured to receive a second control voltage, the first electroactive element located in a first region of the warpage control panel and the second electroactive element located in a second region of the warpage control panel.

8. The method of claim 7, wherein the warpage control carrier is further configured for substantially flattening the panel while the first control voltage is applied to the first electroactive element and the second control voltage is applied to the second electroactive element.

9. The method of claim 7, wherein the first electroactive element located in the first region of the warpage control panel is oriented orthogonal to the second electroactive element located in the second region of the warpage control panel.

10. The method of claim 1, wherein forming the panel further comprises removing the carrier substrate after encapsulating with an encapsulant to expose the active side of the panel.

11. A method of manufacturing a semiconductor device packaging panel, the method comprising:
   forming a panel having an active side and a backside, the panel including:
      placing a plurality of semiconductor die on a first side of a carrier substrate;
      encapsulating with an encapsulant the plurality semiconductor die and exposed portions of the first side of the carrier substrate;
   attaching a warpage control carrier onto the backside of the panel, the warpage control carrier including a first electroactive element; and
   applying a first control voltage to the first electroactive element of the warpage control carrier to substantially flatten the panel.

12. The method of claim 11, further comprising forming a planar-sensitive layer over the plurality of semiconductor die at the active side of the panel while the panel is substantially flattened on the warpage control carrier.

13. The method of claim 11, wherein the warpage control carrier further includes a sensor element configured to provide an output voltage indicative of panel warpage while the warpage control carrier is attached to the backside of the panel.

14. The method of claim 13, wherein the first control voltage applied to the first electroactive element is based on the output voltage of the sensor element.

15. The method of claim 11, wherein the first control voltage applied to the first electroactive element is derived from a look-up table.

16. The method of claim 11, wherein the warpage control carrier further includes a second electroactive element located in a region of the warpage control panel substantially different from the first electroactive element, and wherein the panel is substantially flattened while the first control voltage is applied to the first electroactive element and a second control voltage is applied to the second electroactive element.

* * * * *